(12) United States Patent
Lin

(10) Patent No.: US 11,075,607 B1
(45) Date of Patent: Jul. 27, 2021

(54) HIGH-SPEED DIFFERENTIAL TRANSIMPEDANCE AMPLIFIER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/005,564

(22) Filed: Aug. 28, 2020

(51) Int. Cl.
*H03F 1/42* (2006.01)
*H03F 3/45* (2006.01)

(52) U.S. Cl.
CPC ........... *H03F 1/42* (2013.01); *H03F 3/45264* (2013.01); *H03F 2200/36* (2013.01); *H03F 2203/45018* (2013.01)

(58) Field of Classification Search
CPC ...................................................... H03F 1/42
See application file for complete search history.

(56) References Cited

U.S. PATENT DOCUMENTS

| 7,382,190 | B2* | 6/2008 | Gilbert ................. | H03G 1/0035 330/254 |
| 8,536,945 | B2* | 9/2013 | Hoogzaad ........... | H03F 3/45089 330/252 |
| 2011/0275341 | A1* | 11/2011 | Landmark .............. | H04B 1/109 455/318 |
| 2015/0077183 | A1* | 3/2015 | Ciubotaru ........... | H03F 3/45179 330/254 |
| 2017/0155362 | A1* | 6/2017 | Selvanayagam ..... | H03K 5/1565 |

\* cited by examiner

*Primary Examiner* — Patricia T Nguyen
(74) *Attorney, Agent, or Firm* — McClure, Qualey & Rodack, LLP

(57) ABSTRACT

A differential transimpedance amplifier includes a first pair of common-gate amplifiers having a first NMOS transistor and a second NMOS transistor configured in a cross-coupling topology using a first capacitor and a second capacitor, a second pair of common-gate amplifiers comprising a first PMOS transistor and a second PMOS transistor configured in a cross-coupling topology using a third capacitor and a fourth capacitor, wherein an output of the first pair of common-gate amplifiers and an output of the second pair of common-gate amplifiers are coupled via a fifth capacitor and a sixth capacitor.

19 Claims, 4 Drawing Sheets

HIGH-SPEED DIFFERENTIAL TRANSIMPEDANCE AMPLIFIER AND METHOD THEREOF

BACKGROUND OF THE DISCLOSURE

Field of the Disclosure

The present disclosure generally relates to transimpedance amplifiers, and more particularly differential transimpedance amplifiers that can work over a wide bandwidth.

Description of Related Art

A signal is typically represented by either a voltage or a current of a variable level that carries certain information that can vary over time. A level of the signal at a moment represents a state of the signal at that moment.

A transimpedance amplifier receives an input signal at an input node and output an output signal at an output node, wherein the input node is a low impedance node and the output node is a high impedance node. The input signal is a current, while the output signal is a voltage. A ratio between the output signal and the input signal is a gain of the transimpedance amplifier.

A differential signal is a signal comprising a first sub-signal and a second sub-signal, wherein a value of the differential signal is a difference between the first sub-signal and a second sub-signal. The first sub-signal and the second sub-signal are of the same magnitude and frequency but opposite in phase.

A differential transimpedance amplifier is a transimpedance amplifier, wherein both the input signal and the output signal are differential signals.

A transimpedance amplifier is usually embodied by an operational amplifier configured in a negative feedback topology with a feedback resistance, wherein the feedback resistance determines a gain of the transimpedance amplifier. An operational amplifier configured in a negative feedback topology, however, has a limited bandwidth due to stability consideration. In practice, a differential transimpedance amplifier based on using a differential operational amplifier configured in a feedback topology can only work to a few mega-Hertz, using a modern CMOS (complementary metal oxide semiconductor) process technology.

What is desired is a differential transimpedance amplifier that can work over a ten giga-Hertz bandwidth.

BRIEF DESCRIPTION OF THIS DISCLOSURE

In an embodiment, a differential transimpedance amplifier (DTIA) comprises: a first pair of common-gate amplifiers comprising a first NMOS (n-channel metal oxide semiconductor) transistor and a second NMOS transistor configured in a cross-coupling topology using a first capacitor and a second capacitor; a second pair of common-gate amplifiers comprising a first PMOS (p-channel metal oxide semiconductor) transistor and a second PMOS transistor configured in a cross-coupling topology using a third capacitor and a fourth capacitor, wherein an output of the first pair of common-gate amplifiers and an output of the second pair of common-gate amplifiers are coupled via a fifth capacitor and a sixth capacitor.

In an embodiment, a differential transimpedance amplifier (DTIA) comprises: a first differential pair comprising a first NMOS (n-channel metal oxide semiconductor) transistor and a second NMOS transistor, a second differential pair comprising a first PMOS (p-channel metal oxide semiconductor) transistor and a second PMOS transistor, a first capacitor, a second capacitor, a third capacitor, a fourth capacitor, a fifth capacitor, a sixth capacitor, a first bias network, a second bias network, a third bias network, a fourth bias network, a first load network, a second load network, a third load network, and a fourth load network, wherein: a source, a gate, and a drain of the first NMOS transistor connect to a first input node, a first gate node, and a first output node, respectively; a source, a gate, and a drain of the second NMOS transistor connect to a second input node, a second gate node, and a second output node, respectively; a source, a gate, and a drain of the first PMOS transistor connect to the first input node, a third gate node, and a third output node, respectively; a source, a gate, and a drain of the second PMOS transistor connect to the second input node, a fourth gate node, and a fourth output node, respectively; the first capacitor couples the first gate node to the second input node; the second capacitor couples the second gate node to the first input node; the third capacitor couples the third gate node to the second input node; the fourth capacitor couples the fourth gate node to the first input node; the fifth capacitor couples the first output node to the third output node; the sixth capacitor couples the second output node to the fourth output node; the first bias network establishes a first DC (direct current) bias at the first gate node; the second bias network establishes a second DC bias at the second gate node; the third bias network establishes a third DC bias at the third gate node; the fourth bias network establishes a fourth DC bias at the fourth gate node; the first load network provides DC coupling between a power supply node and the first output node; the second load network provides DC coupling between the power supply node and the second output node; the third load network provides DC coupling between a ground node and the third output node; and the fourth load network provides DC coupling between the ground node and the fourth output node.

In an embodiment, a method comprises: incorporating a first NMOS transistor configured in a common-gate amplifier topology, wherein a source, a gate, and a drain of the first NMOS transistor connect to a first input node, a first gate node, and a first output node, respectively; incorporating a second NMOS transistor configured in a common-gate amplifier topology, wherein a source, a gate, and a drain of the second NMOS transistor connect to a second input node, a second gate node, and a second output node, respectively; incorporating a first PMOS transistor configured in a common-gate amplifier topology, wherein a source, a gate, and a drain of the first PMOS transistor connect to the first input node, a third gate node, and a third output node, respectively; incorporating a second PMOS transistor configured in a common-gate amplifier topology, wherein a source, a gate, and a drain of the second PMOS transistor connect to the second input node, a fourth gate node, and a fourth output node, respectively; using a first capacitor to couple the second input node to the first gate node; using a second capacitor to couple the first input node to the second gate node; using a third capacitor to couple the second input node to the third gate node; using a fourth capacitor to couple the first input node to the fourth gate node; using a fifth capacitor to couple the first output node to the third output node; using a sixth capacitor to couple the second output node to the fourth output node; establishing a first DC (direct current) bias at the first gate node using a first bias network; establishing a second DC bias at the second gate node using a second bias network; establishing a third DC bias at the third gate node using a third bias network; establishing a fourth DC bias at the fourth gate node using fourth bias network; using a first load network to provide DC coupling between the first output node and a power supply node; using a second load network to provide DC coupling between the second output node and the power supply node; using a third load network to provide DC coupling between the third output node and a ground node; and using a fourth load network to provide DC coupling between the fourth output node and the ground node.

DETAILED DESCRIPTION OF THIS DISCLOSURE

Figure 1:
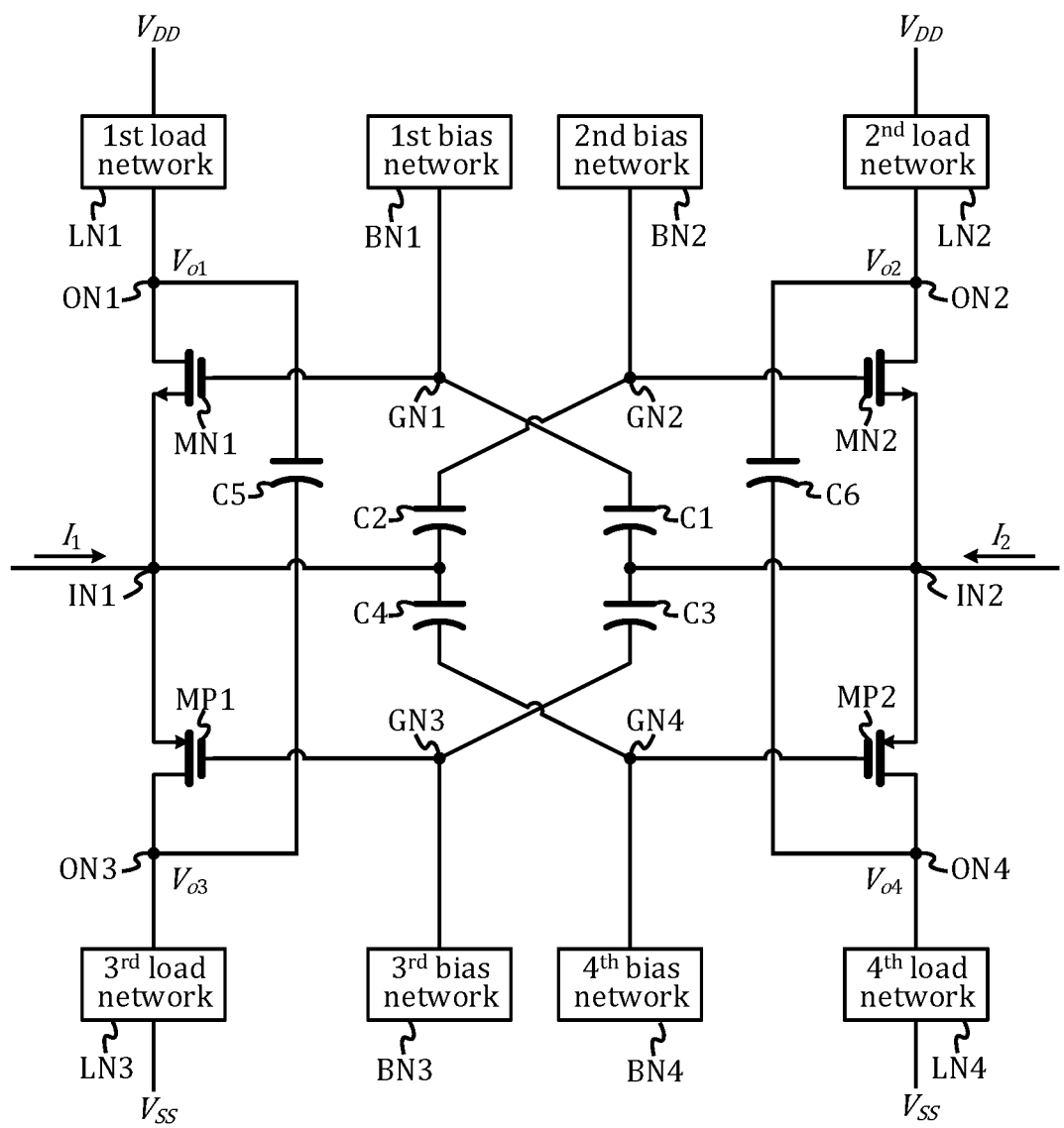
FIG. 1 shows a schematic diagram of a differential transimpedance amplifier in accordance with an embodiment of the present disclosure.

The present disclosure is directed to transimpedance amplifiers. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "frequency," "power supply," "ground," "CMOS (complementary metal oxide semiconductor)," "NMOS (n-channel metal oxide semiconductor)," "PMOS (p-channel metal oxide semiconductor)," "capacitor," "resistor," "amplifier," "common-gate amplifier," "differential," "AC (alternate current)" "DC (direct current)," "bias," and "load." Terms like these are used in a context of microelectronics, and the associated concepts are apparent to those of ordinary skills in the art and thus will not be explained in detail here.

Those of ordinary skill in the art can recognize a capacitor symbol, a resistor symbol, and can recognize a MOS (metal-oxide semiconductor) transistor symbol, for both PMOS transistor and NMOS transistor, and identify a "source" terminal, a "gate" terminal, and a "drain" terminal thereof. Those of ordinary skills in the art can read schematics of a circuit comprising components such as capacitors, resistors, NMOS transistors, PMOS transistors, and so on, and do not need a verbose description about how one component connects with another in the schematics. Pertaining to a MOS transistor, for brevity, hereafter, "source terminal" is simply referred to as "source," "gate terminal" is simply referred to "gate," and "drain terminal" is simply referred to "drain." Those of ordinary skill in the art also understand meanings of units such as "Ohm," "KOhm (kilo-Ohm)," "GHz (giga Hertz)," "nm (nanometer)," "μA (micro-Ampere)," and "μm (micron)."

This present disclosure is disclosed in terms of an engineering sense. For instance, regarding two variables X and Y, when it is said that "X is equal to Y," it means that "X is approximately equal to Y," i.e. "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

Throughout this disclosure, "$V_{DD}$" denotes a power supply node and "$V_{SS}$" denotes a ground node. A voltage at a ground node is substantially stationary and approximately zero. A voltage at a power supply node is substantially stationary and approximately equal to a supply voltage that is higher than zero. In this disclosure, depending on a context that is apparent to those of ordinary skill in the art, sometimes $V_{DD}$ refers to the voltage level at the power supply node $V_{DD}$. For instance, it is apparent that when it is said that "$V_{DD}$ is 1.05V" it means that the voltage level at the power supply node $V_{DD}$ is 1.05V.

A circuit is a collection of a transistor, a capacitor, a resistor, and/or other electronic devices inter-connected in a certain manner to embody a certain function. A network is a circuit or a collection of circuits.

An AC (alternate current) coupling between a first node and a second node causes an instantaneous change of a voltage at the first node to be approximately equal to an instantaneous change of a voltage at the second node, and no DC (direct current) can flow between the first node and the second node. AC coupling is usually fulfilled by using a capacitor of a sufficiently large value.

A DC (direct current) coupling between a first node and a second node allows a direct current flow between the first node and the second node.

A common-gate amplifier comprises a MOS transistor that is configured to receive an input via its source and output an output via its drain in accordance with a control received via its gate.

A schematic diagram of a differential transimpedance amplifier 100 (hereafter DTIA 100) in accordance with an embodiment of the present disclosure is shown in FIG. 1. DTIA 100 receives a first current $I_1$ and a second current $I_2$ via a first input node IN1 and a second input node IN2, respectively, and output a first output voltage $V_{o1}$, a second output voltage $V_{o2}$, a third output voltage $V_{o3}$, and a fourth output voltage $V_{o4}$ at a first output node ON1, a second output node ON2, a third output node ON3, and a fourth output node ON4, respectively. DTIA 100 comprises a first NMOS transistor MN1, a second NMOS transistor MN2, a first PMOS transistor MP1, a second PMOS transistor MP2, a first load network LN1, a second load network LN2, a third load network LN3, a fourth load network LN4, a first capacitor C1, a second capacitor C2, a third capacitor C3, a fourth capacitor C4, a fifth capacitor C5, a sixth capacitor C6, a first bias network BN1, a second bias network BN2, a third bias network BN3, and a fourth bias network BN4. There are four gate nodes including a first gate node GN1, a second gate node GN2, a third gate node GN3, and a fourth gate node GN4. As mentioned earlier, "$V_{DD}$" denotes a power supply node and "$V_{SS}$" denotes a ground node.

Hereafter, for brevity, the first (second) NMOS transistor MN1 (MN2) is simply referred to as MN1 (MN2), the first (second) PMOS transistor MP1 (MP2) is simply referred to as MP1 (MP2), the first (second, third, fourth, fifth, sixth) capacitor C1 (C2, C3, C4, C5, C6) is simply referred to as C1 (C2, C3, C4, C5, C6), the first (second, third, fourth) bias network BN1 (BN2, BN3, BN4) is simply referred to as BN1 (BN2, BN3, BN4), the first (second, third, fourth) load network LN1 (LN2, LN3, LN4) is simply referred to as LN1 (LN2, LN3, LN4), the first (second, third, fourth) gate node GN1 (GN2, GN3, GN4) is simply referred to as GN1 (GN2, GN3, GN4), the first (second, third, fourth) output node ON1 (ON2, ON3, ON4) is simply referred to as ON1 (ON2, ON3, ON4), the first (second) input node IN1 (IN2) is simply referred to as IN1 (IN2), and the first (second, third, fourth) output voltage $V_{o1}$ ($V_{o2}$, $V_{o3}$, $V_{o4}$) is simply referred to as $V_{o1}$ ($V_2$, $V_{o3}$, $V_{o4}$). The above simplifications in referencing will not cause any ambiguity, because all labels in this entire disclosure are unique. For instance, there is no other "MN1" in the entire disclosure except "the first NMOS transistor MN1," therefore when "MN1" is mentioned it must be referring to "the first NMOS transistor MN1" without ambiguity.

A source, a gate, and a drain of MN1 (MN2) connect to IN1 (IN2), GN1 (GN2), and ON1 (ON2), respectively. A source, a gate, and a drain of MP1 (MP2) connect to IN1 (IN2), GN3 (GN4), and ON3 (ON4), respectively. C1 (C2, C3, C4) provides AC coupling between the IN2 (IN1, IN1, IN2) and GN1 (GN2, GN3, GN4). BN1 (BN2, BN3, BN4) connects to GN1 (GN2, GN3, GN4) to establish a first (second, third, fourth) DC (direct current) bias for MN1 (MN2, MP1, MP2). LN1 (LN2) provides DC coupling between ON1 (ON2) and the power supply node $V_{DD}$ and serves as a load for MN1 (MN2). LN3 (LN4) provides DC coupling between ON3 (ON4) and the ground node $V_{SS}$ and serves as a load for MP1 (MP2). C5 (C6) provides AC coupling between ON1 (ON2) and ON3 (ON4).

All the four transistors MN1, MN2, MP1, and MP2 are configured in common-gate amplifier topology, wherein a bias condition is established by BN1, BN2, BN3, and BN4, respectively. MN1 and MN2 are cross-coupled via C1 and C2: the gate of MN1 couples to the source of MN2 via C1, and the gate of MN2 couples to the source of MN1 via C2. The cross coupling between MN1 and MN2 mutually enhances a gain for each other. Likewise, MP1 and MP2 are cross-coupled via C3 and C4: the gate of MP1 couples to the source of MP2 via C3, and the gate of MP2 couples to the source of MP1 via C4. The cross coupling between MP1 and MP2 mutually enhances a gain for each other. LN1 and LN2 are configured to provide a termination for common-gate amplifiers embodied by MN1 and MN2, respectively, from the power supply node $V_{DD}$, LN3 and LN4 are configured to provide a termination for common-gate amplifiers embodied by MP1 and MP2, respectively, from the ground node $V_{SS}$.

There are two important features of DTIA 100. First, a complementary differential topology is used, wherein MN1 and MN2 form a first differential pair, MP1 and MP2 form a second differential pair, and the first differential pair and the second differential pair are complementary and a direct current of the first differential pair is re-used by the second differential pair. A direct current flowing through MN1 is re-used by MP1, while a direct current flowing through MN2 is re-used by MP2. The current re-use results in an efficient way of using energy. Second, there are four outputs, $V_{o1}$, $V_{o2}$, $V_{o3}$, and $V_{o4}$, but $V_{o1}$ and $V_{o3}$ are AC coupled vis C5, while $V_{o2}$ and $V_{o4}$ are AC coupled via C6. Due to the AC coupling of C5, $V_{o1}$ and $V_{o3}$ are virtually the same signal, wherein an instantaneous change of $V_{o1}$ is approximately equal to an instantaneous change of $V_{o3}$. Likewise, due to the AC coupling of C6, $V_{o2}$ and $V_{o4}$ are virtually the same signal. $V_{o1}$ and $V_{o3}$ are helping each other via C5 to extend an output swing. Without C5, $V_{o1}$ has a higher bound due to a headroom limited by $V_{DD}$ since MN1 has no force to pull high Vo, while $V_{o3}$ has a lower bound due to a headroom limited by $V_{SS}$ since MP1 has no force to pull low $V_{o3}$. Due to the AC coupling via C5, $V_{o1}$ can be pulled high by MP1 via C5 and swing higher than the higher bound, while $V_{o3}$ can be pulled low by MN1 via C5 and swing lower than the lower bound. Likewise, $V_{o2}$ and $V_{o4}$ are helping each other via C6 to extend an output swing. Therefore, the first differential pair and the second differential pair are complementary and helping each other to extend the output swing.

Figure 2:
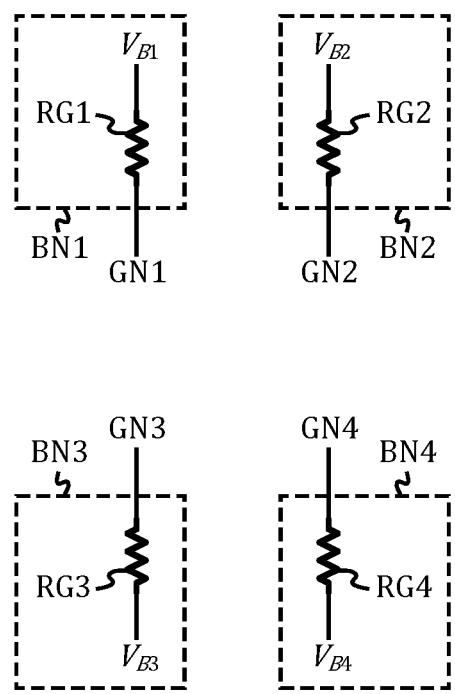
FIG. 2 shows a schematic diagram of bias networks that can be used in the differential transimpedance amplifier of FIG. 1.

An embodiment of BN1, BN2, BN3, and BN4 is shown in FIG. 2. BN1 comprises a first gate resistor RG1 configured to couple a first bias voltage $V_{B1}$ to GN1. BN2 comprises a second gate resistor RG2 configured to couple a second bias voltage $V_{B2}$ to GN2. BN3 comprises a third gate resistor RG3 configured to couple a third bias voltage $V_{B3}$ to GN3. BN4 comprises a fourth gate resistor RG4 configured to couple a fourth bias voltage $V_{B3}$ to GN4. In an embodiment, the first bias voltage $V_{B1}$ is the same as the second bias voltage $V_{B2}$, while the third bias voltage $V_{B3}$ is the same as the fourth bias voltage $V_{B4}$.

Figure 3:
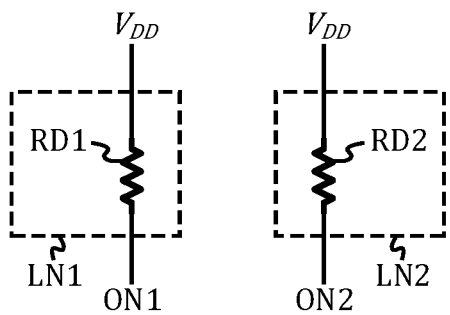
FIG. 3 shows a schematic diagram of load networks that can be used in the differential transimpedance amplifier of FIG. 1.
Figure 3:
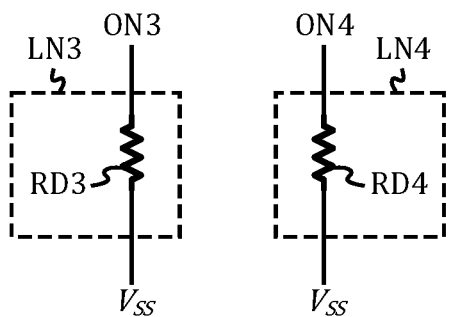

An embodiment of LN1, LN2, LN3, and LN4 is shown in FIG. 3. LN1 comprises a first drain resistor RD1 configured to couple the power supply node $V_{DD}$ to ON1. LN2 comprises a second drain resistor RD2 configured to couple the power supply node $V_{DD}$ to ON2. LN3 comprises a third drain resistor RD3 configured to couple the ground node $V_{SS}$ to ON3. LN4 comprises a fourth drain resistor RD4 configured to couple the ground node $V_{SS}$ to ON4.

Figure 4:
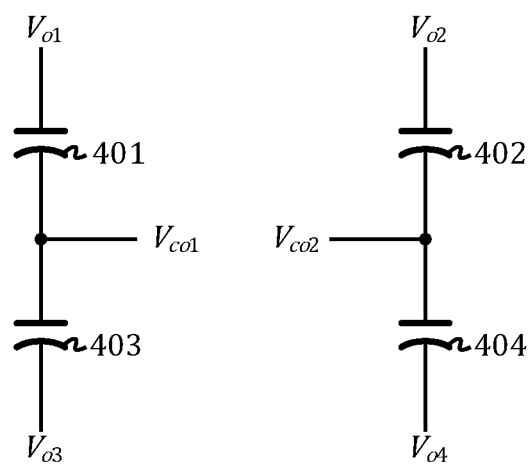
FIG. 4 shows a schematic diagram of an output-combining network.

In a further embodiment shown in FIG. 4, an output-combining network 400 is used to consolidate $V_{o1}$, $V_{o2}$, $V_{o3}$, and $V_{o4}$, into two consolidated output voltages including a first consolidated output voltage $V_{co1}$ and a second consolidated output voltage $V_{co2}$. Output-combining network 400 comprises four additional capacitors 401, 402, 403, and 404. The four additional capacitors 401, 402, 403, and 404, are identical. Capacitors 401 and 403 embody a first mean function and are used to establish the first consolidated output voltage $V_{co1}$ to be a mean of $V_{o1}$ and $V_{o3}$, as far as an AC component is concerned; likewise, capacitors 402 and 404 embody a second mean function and are used to establish the second consolidated output voltage $V_{co2}$ to be a mean of $V_{o2}$ and $V_{o4}$, as far as an AC component is concerned.

DTIA 100 can be a high-speed circuit, because it is an open-loop circuit without a speed limit set by stability.

By way of example but not limitation: DTIA 100 is fabricated using a 28 nm CMOS process; $V_{DD}$ is 1.05V; $V_{SS}$ is 0V; the first current $I_1$ and the second current $I_2$ are of the same magnitude 200 μA, the same frequency 14.4 GHz, but opposite in phase; width and length are 9.6 μm and 30 nm, respectively, for all four transistors MN1, MN2, MP1, and MP2; capacitors C1, C2, C3, and C4 are all 200 fF; capacitors C5 and C6 are both 32 fF; resistors RG1, RG2, RG3, and RG4 in FIG. 2 are all 12 KOhm; $V_{B1}$ and $V_{B2}$ in FIG. 2 are both 1.05V; $V_{B3}$ and $V_{B4}$ in FIG. 2 are both 0V, respectively; resistors RD1, RD2, RD3, and RD4 in FIG. 3 are all 800 Ohm; and capacitors 401, 402, 403, and 404 in FIG. 4 are all 25 fF.

Figure 5:
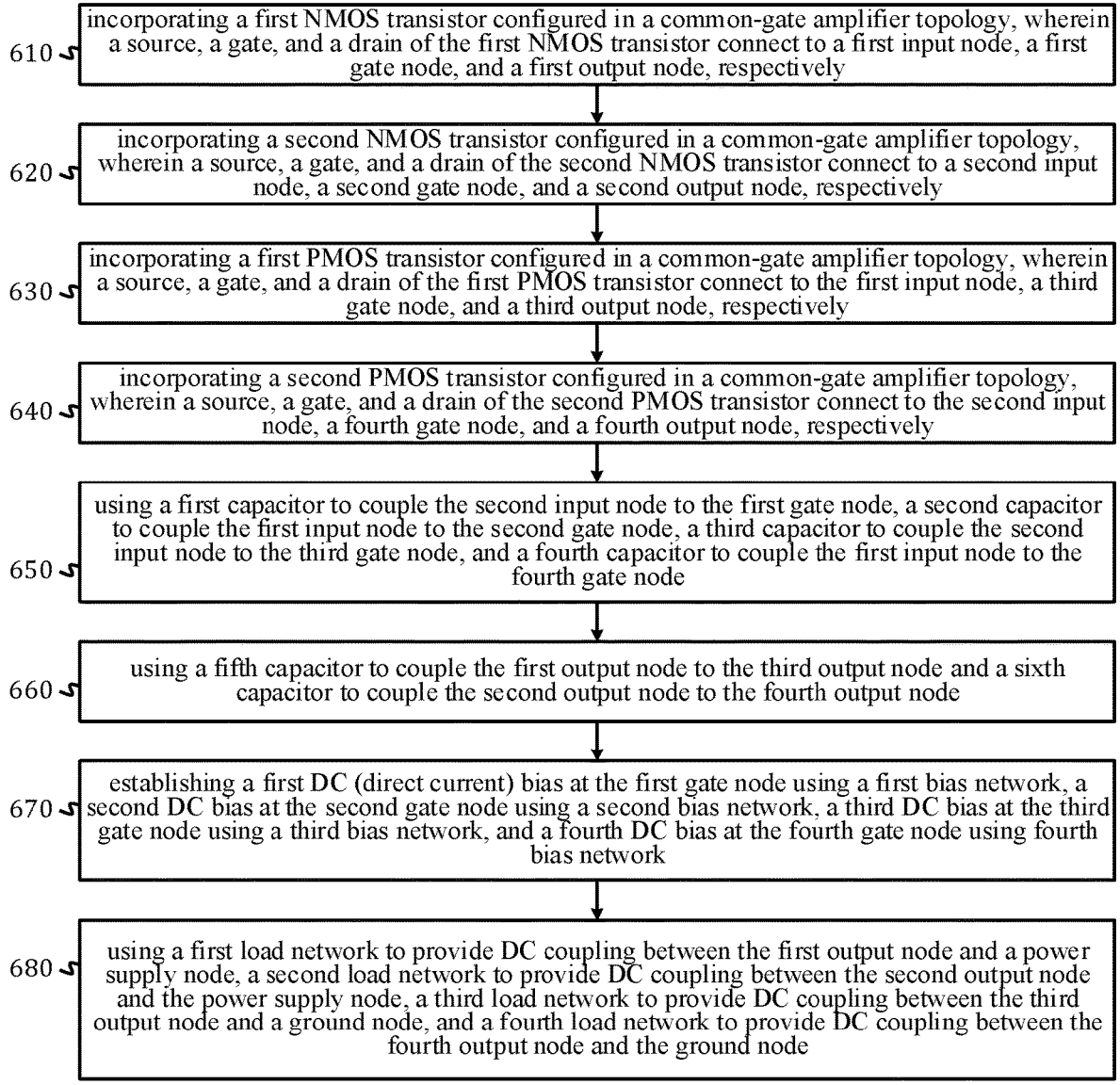
FIG. 5 shows a flow diagram of a method in accordance with the present disclosure.

As illustrated by a flow chart shown in FIG. 5, a method in accordance with an embodiment of the present disclosure comprises: (step 610) incorporating a first NMOS transistor configured in a common-gate amplifier topology, wherein a source, a gate, and a drain of the first NMOS transistor connect to a first input node, a first gate node, and a first output node, respectively; (step 620) incorporating a second NMOS transistor configured in a common-gate amplifier topology, wherein a source, a gate, and a drain of the second NMOS transistor connect to a second input node, a second gate node, and a second output node, respectively; (step 630) incorporating a first PMOS transistor configured in a common-gate amplifier topology, wherein a source, a gate, and a drain of the first PMOS transistor connect to the first input node, a third gate node, and a third output node, respectively; (step 640) incorporating a second PMOS transistor configured in a common-gate amplifier topology, wherein a source, a gate, and a drain of the second PMOS transistor connect to the second input node, a fourth gate node, and a fourth output node, respectively; (step 650) using a first capacitor to couple the second input node to the first gate node, a second capacitor to couple the first input node to the second gate node, a third capacitor to couple the second input node to the third gate node, and a fourth capacitor to couple the first input node to the fourth gate node; (step 660) using a fifth capacitor to couple the first output node to the third output node and a sixth capacitor to couple the second output node to the fourth output node; (step 670) establishing a first DC (direct current) bias at the first gate node using a first bias network, a second DC bias at the second gate node using a second bias network, a third DC bias at the third gate node using a third bias network, and a fourth DC bias at the fourth gate node using fourth bias network; and (step 680) using a first load network to provide DC coupling between the first output node and a power supply node, a second load network to provide DC coupling between the second output node and the power supply node, a third load network to provide DC coupling between the third output node and a ground node, and a fourth load network to provide DC coupling between the fourth output node and the ground node.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A differential transimpedance amplifier (DTIA) comprising: a first differential pair comprising a first NMOS (n-channel metal oxide semiconductor) transistor and a second NMOS transistor, a second differential pair comprising a first PMOS (p-channel metal oxide semiconductor) transistor and a second PMOS transistor, a first capacitor, a second capacitor, a third capacitor, a fourth capacitor, a fifth capacitor, a sixth capacitor, a first bias network, a second bias network, a third bias network, a fourth bias network, a first load network, a second load network, a third load network, and a fourth load network, wherein:

a source, a gate, and a drain of the first NMOS transistor connect to a first input node, a first gate node, and a first output node, respectively;

a source, a gate, and a drain of the second NMOS transistor connect to a second input node, a second gate node, and a second output node, respectively;

a source, a gate, and a drain of the first PMOS transistor connect to the first input node, a third gate node, and a third output node, respectively;

a source, a gate, and a drain of the second PMOS transistor connect to the second input node, a fourth gate node, and a fourth output node, respectively;

the first capacitor couples the first gate node to the second input node;

the second capacitor couples the second gate node to the first input node;

the third capacitor couples the third gate node to the second input node;

the fourth capacitor couples the fourth gate node to the first input node;

the fifth capacitor couples the first output node to the third output node;

the sixth capacitor couples the second output node to the fourth output node;

the first bias network establishes a first DC (direct current) bias at the first gate node;

the second bias network establishes a second DC bias at the second gate node;

the third bias network establishes a third DC bias at the third gate node;

the fourth bias network establishes a fourth DC bias at the fourth gate node;

the first load network provides DC coupling between a power supply node and the first output node;

the second load network provides DC coupling between the power supply node and the second output node;

the third load network provides DC coupling between a ground node and the third output node; and the fourth load network provides DC coupling between the ground node and the fourth output node.

2. The DTIA of claim 1, wherein a first current is received at the first input node, a second current is received at the second input node, and the first current and the second current are of the same magnitude and frequency but opposite phase.

3. The DTIA of claim 1 further comprising an output combining network configured to receive a first output voltage at the first output node, a second output voltage at the second output node, a third output voltage at the third node, and a fourth output voltage at the fourth output node and output a first consolidated output voltage and a second consolidated output voltage.

4. The DTIA of claim 3, wherein: the output combining network comprises a first additional capacitor, a second additional capacitor, a third additional capacitor, and a fourth additional capacitor; the first additional capacitor and the third additional capacitor embody a first mean function to establish the first consolidated output voltage to be a mean of the first output voltage and the third output voltage, and the second additional capacitor and the fourth additional capacitor embody a second mean function to establish the second consolidated output to be a mean of the second output voltage and the fourth output voltage.

5. The DTIA of claim 1, wherein: the first bias network comprises a first gate resistor that couples the first gate node to a first bias voltage, the second bias network comprises a second gate resistor that couples the second gate node to a second bias voltage, the third bias network comprise a third resistor that couples the third gate node to a third bias voltage, and the fourth bias network comprises a fourth gate resistor that couples the fourth gate node to a fourth bias voltage.

6. The DTIA of claim 1, wherein: the first load network comprises a first drain resistor that couples the first output node to the power supply node; the second load network comprises a second drain resistor that couples the second output node to the power supply node; the third load network comprises a third drain resistor that couples the third output node to the ground node; and the fourth load network comprises a fourth drain resistor that couples the fourth output node to the power supply node.

7. A method comprising:
incorporating a first NMOS (n-channel metal oxide semiconductor) transistor configured in a common-gate amplifier topology, wherein a source, a gate, and a drain of the first NMOS transistor connect to a first input node, a first gate node, and a first output node, respectively;
incorporating a second NMOS transistor configured in a common-gate amplifier topology, wherein a source, a gate, and a drain of the second NMOS transistor connect to a second input node, a second gate node, and a second output node, respectively;
incorporating a first PMOS (p-channel metal oxide semiconductor) transistor configured in a common-gate amplifier topology, wherein a source, a gate, and a drain of the first PMOS transistor connect to the first input node, a third gate node, and a third output node, respectively;
incorporating a second PMOS transistor configured in a common-gate amplifier topology, wherein a source, a gate, and a drain of the second PMOS transistor connect to the second input node, a fourth gate node, and a fourth output node, respectively;
using a first capacitor to couple the second input node to the first gate node, a second capacitor to couple the first input node to the second gate node, a third capacitor to couple the second input node to the third gate node, and a fourth capacitor to couple the first input node to the fourth gate node;
using a fifth capacitor to couple the first output node to the third output node and a sixth capacitor to couple the second output node to the fourth output node;
establishing a first DC (direct current) bias at the first gate node using a first bias network, a second DC bias at the second gate node using a second bias network, a third DC bias at the third gate node using a third bias network, and a fourth DC bias at the fourth gate node using fourth bias network; and
using a first load network to provide DC coupling between the first output node and a power supply node, a second load network to provide DC coupling between the second output node and the power supply node, a third load network to provide DC coupling between the third output node and a ground node, and a fourth load network to provide DC coupling between the fourth output node and the ground node.

8. The method of claim 7, wherein a first current is received at the first input node, a second current is received at the second input node, and the first current and the second current are of the same magnitude and frequency but opposite phase.

9. The method of claim 7 further comprising using a output combining network configured to receive a first output voltage at the first output node, a second output voltage at the second output node, a third output voltage at the third node, and a fourth output voltage at the fourth output node and output a first consolidated output voltage and a second consolidated output voltage.

10. The method of claim 9, wherein: the output combining network comprises a first additional capacitor, a second additional capacitor, a third additional capacitor, and a fourth additional capacitor; the first additional capacitor and the third additional capacitor embody a first mean function to establish the first consolidated output voltage to be a mean of the first output voltage and the third output voltage; and the second additional capacitor and the fourth additional capacitor embody a second mean function to establish the second consolidated output to be a mean of the second output voltage and the fourth output voltage.

11. The method of claim 7, wherein: the first bias network comprises a first gate resistor that couples the first gate node to a first bias voltage, the second bias network comprises a second gate resistor that couples the second gate node to a second bias voltage, the third bias network comprise a third resistor that couples the third gate node to a third bias voltage, and the fourth bias network comprises a fourth gate resistor that couples the fourth gate node to a fourth bias voltage.

12. The method of claim 7, wherein: the first load network comprises a first drain resistor that couples the first output node to the power supply node; the second load network comprises a second drain resistor that couples the second output node to the power supply node; the third load network comprises a third drain resistor that couples the third output node to the ground node; and the fourth load network comprises a fourth drain resistor that couples the fourth output node to the power supply node.

13. A differential transimpedance amplifier (DTIA) comprising:
a first pair of common-gate amplifiers comprising a first NMOS (n-channel metal oxide semiconductor) transistor and a second NMOS transistor configured in a cross-coupling topology using a first capacitor and a second capacitor;
a second pair of common-gate amplifiers comprising a first PMOS (p-channel metal oxide semiconductor) transistor and a second PMOS transistor configured in a cross-coupling topology using a third capacitor and a fourth capacitor, wherein an output of the first pair of common-gate amplifiers and an output of the second pair of common-gate amplifiers are coupled via a fifth capacitor and a sixth capacitor;
a first load network and a second load network configured to provide DC (direct current) coupling from a power supply node to the first NMOS transistor and the second NMOS transistor, respectively; and a third load network and a fourth load network configured to provide DC coupling from a ground node to the first PMOS transistor and the second PMOS transistor, respectively.

14. The DTIA of claim 13 further comprising: a first bias network and a second bias network configured to establish a bias for the first NMOS transistor and the second NMOS transistor, respectively; and a third bias network and a fourth bias network configured to establish a bias for the first PMOS transistor and the second PMOS transistor, respectively.

15. The DTIA of claim 14, wherein the first bias network comprises a first gate resistor configured to provide DC (direct current) coupling from a first bias voltage, the second bias network comprises a second gate resistor configured to provide DC coupling from a second bias voltage, the third bias network comprises a third gate resistor configured to provide DC coupling from a third bias voltage, and the fourth bias network comprises a fourth gate resistor configured to provide DC coupling from a fourth bias voltage.

16. The DTIA of claim 13, wherein the first load network comprises a first drain resistor, the second load network comprises a second drain resistor, the third load network comprises a third drain resistor, and the fourth load network comprises a fourth drain resistor.

17. The DTIA of claim 13, wherein a first current is received by the first NMOS transistor and the first PMOS transistor, a second current is received by the second NMOS transistor and the second PMOs transistor, and the first current and the second current are of the same magnitude and frequency but opposite phase.

18. The DTIA of claim 13 further comprising an output combining network configured to consolidate the output of the first pair of common-gate amplifiers with the output of the second pair of common-gate amplifiers.

19. The DTIA of claim 18, wherein: the output combining network comprises additional capacitors configured to provide a mean function to establish a consolidated output that is a mean of the output of the first pair of common-gate amplifiers and the output of the second pair of common-gate amplifiers.

* * * * *